United States Patent [19]

Sanchez et al.

[11] Patent Number: 5,789,795
[45] Date of Patent: Aug. 4, 1998

[54] METHODS AND APPARATUS FOR FABRICATIIONG ANTI-FUSE DEVICES

[75] Inventors: Ivan Sanchez, San Antonio; Yu-Pin Han, Dallas; Miguel A. Delgado, San Antonio, all of Tex.; Ying-Tsong Loh, Saratoga, Calif.

[73] Assignee: VLSI Technology, Inc., San Jose, Calif.

[21] Appl. No.: 579,824

[22] Filed: Dec. 28, 1995

[51] Int. Cl.⁶ .................................................. H01L 29/00
[52] U.S. Cl. .................. 257/530; 437/922; 437/228 ES
[58] Field of Search .................. 257/530, 50; 437/922, 437/228 ES, 188

[56] References Cited

U.S. PATENT DOCUMENTS

| | | | |
|---|---|---|---|
| 4,174,521 | 11/1979 | Neale | 357/45 |
| 4,420,766 | 12/1983 | Kasten | 357/59 |
| 4,538,167 | 8/1985 | Yoshino et al. | 357/59 |
| 5,120,679 | 6/1992 | Boardman et al. | 437/195 |
| 5,272,666 | 12/1993 | Tsang et al. | 365/96 |
| 5,290,734 | 3/1994 | Boardman et al. | 437/195 |
| 5,298,784 | 3/1994 | Gambino et al. | 257/529 |
| 5,300,456 | 4/1994 | Tigelaar et al. | 257/530 |
| 5,311,039 | 5/1994 | Kimura et al. | 257/50 |
| 5,328,868 | 7/1994 | Conti et al. | 437/203 |
| 5,373,169 | 12/1994 | McCollum et al. | 257/530 |
| 5,381,035 | 1/1995 | Chen et al. | 257/530 |
| 5,404,029 | 4/1995 | Husher et al. | 257/50 |
| 5,434,432 | 7/1995 | Spratt et al. | 257/50 |
| 5,464,790 | 11/1995 | Hawley | 257/530 |
| 5,493,144 | 2/1996 | Bryant et al. | 257/530 |
| 5,493,146 | 2/1996 | Pramanik et al. | 257/530 |
| 5,557,136 | 9/1996 | Gordon et al. | 257/530 |
| 5,593,920 | 1/1997 | Haslam et al. | 257/530 |

FOREIGN PATENT DOCUMENTS

| | | | |
|---|---|---|---|
| 93/04499 | 3/1993 | WIPO | 257/530 |

OTHER PUBLICATIONS

K.E. Gordon and R.J. Wong, "*Conducting Filament of the Programmed Metal Electrode Amorphous Silicon Antifuse*," QuickLogic Corp., Santa Clara, CA, 1993 IEEE, International Electron Devices Meeting, Dec. 5–8, 1993, Washington, D.C.

Unknown, "*Developments in non-volatile FPGAs,*" Electronic Engineering, Apr. 1993.

*Primary Examiner*—J. Carroll
*Attorney, Agent, or Firm*—Hickman Beyer & Weaver

[57] ABSTRACT

An integrated circuit having a semiconductor substrate and an anti-fuse structure formed on the semiconductor substrate. The anti-fuse structure includes a metal-one layer and an anti-fuse layer disposed above the metal-one layer. The anti-fuse layer has a first resistance value when the anti-fuse structure is unprogrammed and a second resistance value lower than the first resistance value when the anti-fuse structure is programmed. There is further provided an etch stop layer disposed above the anti-fuse layer, and an inter-metal oxide layer disposed above the etch stop layer with the inter-metal oxide layer has a via formed therein. Additionally, there is further provided a metal-two layer disposed above the inter-metal oxide layer. In this structure, a portion of the metal-two layer is in electrical contact with the anti-fuse layer through the via in the inter-metal oxide layer.

13 Claims, 4 Drawing Sheets

METHODS AND APPARATUS FOR FABRICATIONG ANTI-FUSE DEVICES

BACKGROUND OF THE INVENTION

The present invention relates generally to integrated circuit (IC) chips. More particularly, the present invention relates to improved methods and apparatus for fabricating anti-fuse devices in an integrated circuit (IC) chip.

Anti-fuse and fuse structures have been used for sometime in certain classes of IC chips such as field programmable gate arrays, programmable read-only memories (PROMS) and the like. Field programmable gate arrays include a large number of logic elements, such as AND gates and OR gates, which can be selectively coupled together by means of fuses or anti-fuses to perform user designed functions. An unprogrammed fuse-type gate array is programmed by selectively blowing fuses within the device, while an unprogrammed anti-fuse type gate array is programmed by causing selected anti-fuses to become conductive.

There are many types of PROMS including standard, write-once PROMS, erasable programmable read-only memories (EPROMS), electrically erasable programmable read-only memories (EEPROMS), etc. A PROM usually comprises an array of memory cells arranged in rows and columns, which can be programmed to store user data.

Fuses for field programmable gate arrays, PROMS and the like are typically made from a titanium-tungsten (TiW) alloy and are shaped somewhat like a bow-tie having a narrow, central neck and wide ends. The neck of the fuse is typically about 2 microns wide, while the ends of the fuse are typically about 6 microns wide. When a sufficiently high voltage (usually on the order of 10 volts D.C.) is applied to the fuse, the current flowing through the fuse will cause it to heat-up and will eventually melt the fuse at its neck, thereby "blowing" the fuse. Fuses in electronic devices are much more prevalent today than anti-fuses because they are easier to manufacture and have a better record of reliability.

Despite being less popular, anti-fuses do have the very desirable feature of being small in size. For example, a TiW fuse with a 2 micron neck and 6 micron end widths permits approximately 4,000 fuses to be provided on a typical device. In contrast, a 1 or 1.2 micron diameter anti-fuse via permits 80,000-100,000 fuses to be provided on a single device. Therefore, anti-fuses have the potentiality of providing vastly greater numbers of interconnections or of storing much greater amounts of information than devices using fuse technology.

Anti-fuses include a material which initially has a high resistance but which can be converted into a low resistance material by the application of a programming voltage. For example, amorphous silicon, which has an intrinsic resistivity of approximately 1 mega-ohms/cm, can be fashioned into 1 micron wide link vias having a resistance of approximately 1-2 giga-ohms/cm. These link vias can then be melted and recrystallized by the application of a programming voltage in the range of 10-12 volts D.C. to form link vias having a resistance of less than 200 ohms. These low resistance vias can couple together logic elements of a field programmable gate array so that the gate array will perform user-desired functions, or can serve as memory cells of a PROM.

To facilitate further discussion, FIG. 1 schematically illustrates a cross section of a prior art anti-fuse structure 10. Anti-fuse structure 10 includes a metal-one layer 14, which is typically formed over an oxide layer of a semiconductor substrate, e.g., the silicon dioxide layer of a silicon wafer. Metal one layer 14 typically comprises aluminum and/or other suitable conductive materials and may be formed by a conventional physical vapor deposition (PVD) process, such as sputtering.

Above metal-one layer 14, there is disposed an anti-fuse layer 16, which is made of one of the known anti-fuse materials such as amorphous silicon (A-Si). An inter-metal oxide layer 18, typically consisting of silicon dioxide, is deposited above anti-fuse layer 16 by one of the well-known processes such as chemical vapor deposition (CVD).

To create an anti-fuse structure, a via 20 is then etched, using a conventional photoresist process and an appropriate etchant, through inter-metal oxide layer 18. By way of example, one such photoresist technique involves the application of a resist material, the exposure of the resist in a contact or stepper lithography system, and the development of the resist to form a mask to facilitate subsequent etching.

A metal-two layer 22 then fills via 20 to create a metal contact to anti-fuse layer 16 through inter-metal oxide layer 18. Like the metal-one layer, the metal-two layer also comprises aluminum and/or other suitable conductive materials and may also be deposited by a physical vapor deposition process, e.g., sputtering.

The anti-fuse structure of FIG. 1 is programmed by applying a programming voltage between about 10-12 volts D.C. at about 10 mA between metal-one layer 14 and metal-two layer 22. Before programming, anti-fuse structure 10 has a resistance of about 1-2 giga-ohms (for a one micron diameter anti-fuse structure). After being programmed, the same anti-fuse structure 10 may have a resistance of about 20 to 100 ohms.

As is known, the programming voltage of an anti-fuse structure, such as anti-fuse structure 10, is a function of the thickness of its anti-fuse layer, e.g., amorphous silicon anti-fuse layer 16 of FIG. 1. To keep the programming voltage constant for all anti-fuses in an IC, it is desirable to maintain the thickness of the anti-fuse layer within a predefined narrow tolerance window.

It has been found, however, that the oxide etch step, which creates via hole 20, usually does not stop precisely at the interface between inter-metal oxide layer 18 and amorphous silicon layer 16. This oxide etch step may, for example, remove about a few hundred angstroms of amorphous silicon before stopping. The removal of the anti-fuse material under via hole 20 during the oxide etch step affects the uniformity of the anti-fuse layer at the point where the programmed link is most likely to form, which in turn affects the programming voltage of anti-fuse structure 10. In some cases, some of anti-fuse structures 10 in a given IC chip may have their programming voltages raised to the point where they cannot be programmed at all or lowered to the point where they may be inadvertently programmed by the normal operating voltage level of the chip, e.g., 5 volts.

The thickness variations in the amorphous silicon layer introduces deprogrammed states and leads to infant mortality failures, i.e., the anti-fuse fuse link is not properly formed when an appropriate programming voltage is applied, or, once formed, does not stay formed over time.

In view of the foregoing, what is desired is methods and apparatus for improving the uniformity of the anti-fuse layer in an integrated circuit, thereby creating anti-fuse structures with a more constant programming voltage.

SUMMARY OF THE INVENTION

The invention relates, in one embodiment, to a method for fabricating an anti-fuse structure on a semiconductor substrate, which has thereon an anti-fuse layer disposed above a metal-one layer. The method includes the step of depositing an anti-fuse layer above the metal-one layer. The anti-fuse layer has a first resistance value when the anti-fuse structure is unprogrammed and a second resistance value lower than the first resistance value when the anti-fuse structure is programmed. Further, there are included the steps of depositing an etch stop layer above the anti-fuse layer, and depositing an inter-metal oxide layer above the etch stop layer. Additionally, there are included the steps of etching a via through the inter-metal oxide layer, and depositing a metal-two layer above the inter-metal oxide layer and into the via with a portion of the metal-two layer being in electrical contact with the anti-fuse layer through the via in the inter-metal oxide layer.

In another embodiment, the invention relates to an integrated circuit having a semiconductor substrate and an anti-fuse structure formed on the semiconductor substrate. The anti-fuse structure includes a metal-one layer and an anti-fuse layer disposed above the metal-one layer. The anti-fuse layer has a first resistance value when the anti-fuse structure is unprogrammed and a second resistance value lower than the first resistance value when the anti-fuse structure is programmed. There is further provided an etch stop layer disposed above the anti-fuse layer, and an inter-metal oxide layer disposed above the etch stop layer with the inter-metal oxide layer has a via formed therein. Additionally, there is further provided a metal-two layer disposed above the inter-metal oxide layer. In this structure, a portion of the metal-two layer is in electrical contact with the anti-fuse layer through the via in the inter-metal oxide layer.

These and other advantages of the present invention will become apparent upon reading the following detailed descriptions and studying the various figures of the drawings.

DETAILED DESCRIPTION OF THE PREFERRED EMBODIMENTS

Figure 1:
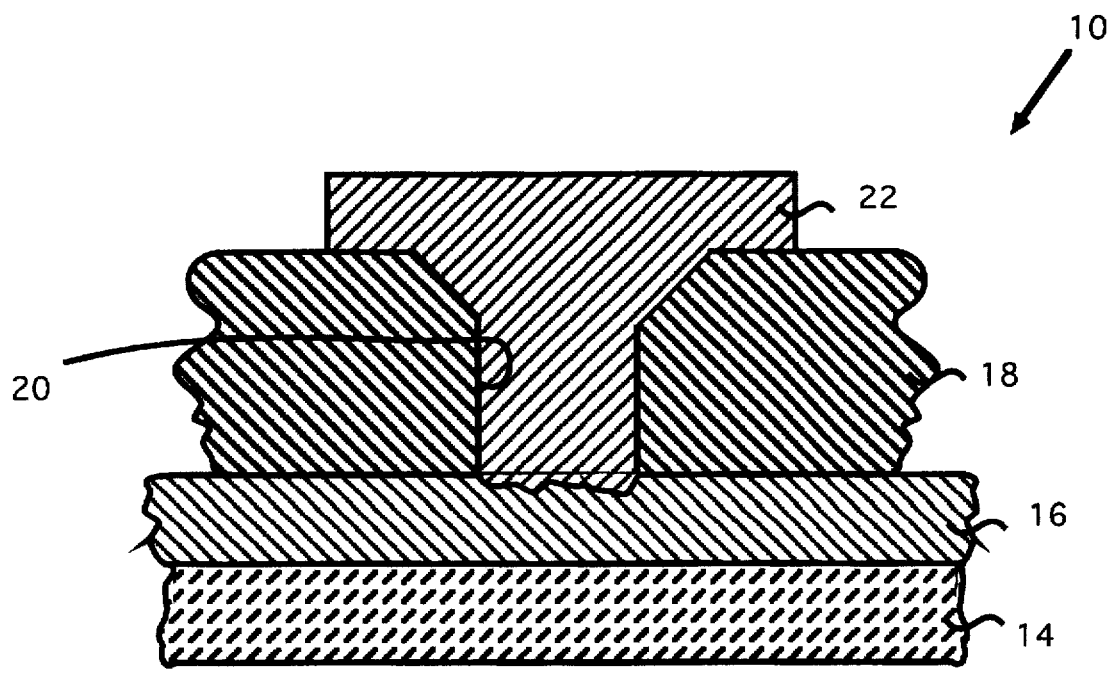
FIG. 1 schematically illustrates a cross section of a prior art anti-fuse structure.

FIG. 1 schematically illustrates a cross section of a prior art anti-fuse structure 10.

Figure 2:
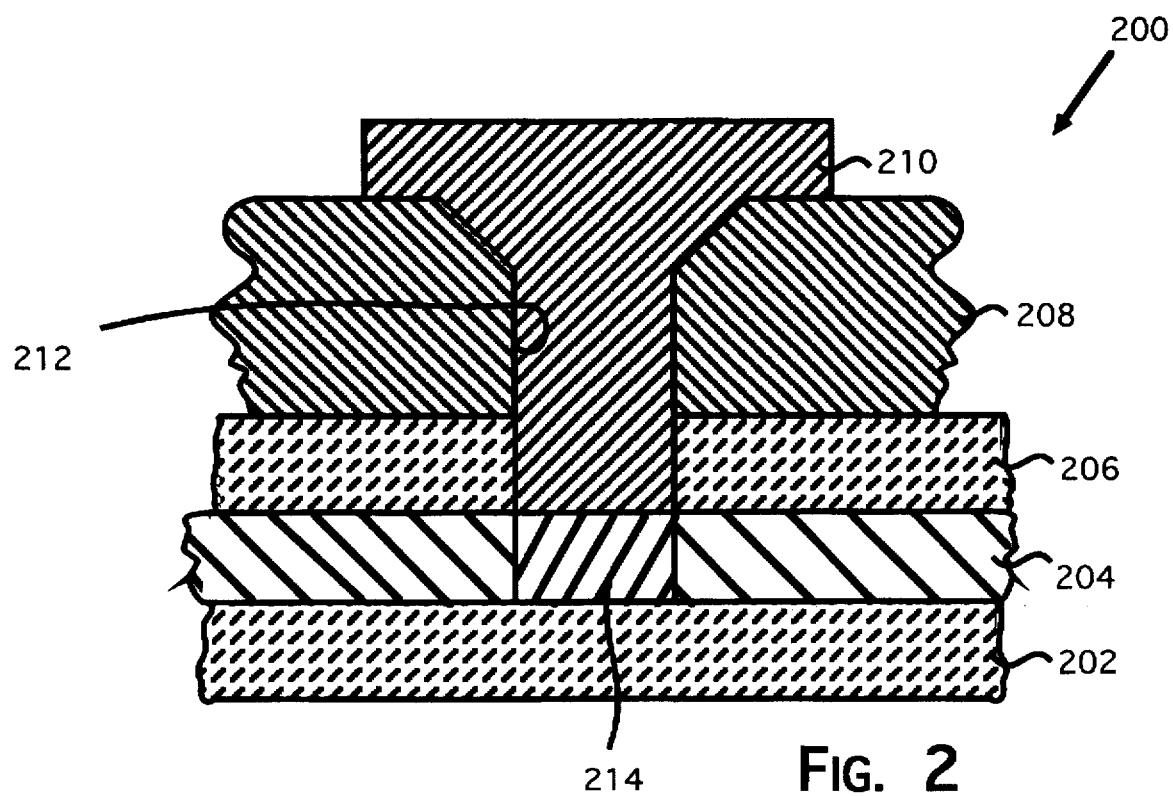
FIG. 2 is a schematic diagram illustrating, in one embodiment of the invention, a dielectric etch stop based anti-fuse structure.

FIG. 2 is a schematic diagram illustrating, in one embodiment of the invention, a dielectric etch stop based anti-fuse structure. The anti-fuse structure of FIG. 2 is said to be dielectric etch stop based because, as will be shown later herein, there is advantageously provided a dielectric etch stop layer to maintain uniform anti-fuse layer thickness. In FIG. 2, anti-fuse structure 200 includes a metal-one layer 202, an anti-fuse layer 204, an etch stop layer 206, an inter-metal oxide layer 208, and a metal-two layer 210.

Like metal-one layer 14 of FIG. 1, metal-one layer 202 is typically disposed above a semiconductor substrate and separated therefrom by a suitable layer of insulator, e.g., silicon dioxide. Metal-one layer 202 is preferably a three-level sandwich of conductive materials comprising a first layer of titanium tungsten (TiW) deposited to a thickness of about 2,200 angstroms, a second layer of aluminum or an alloy of aluminum and copper deposited to a thickness of 4,000 angstroms, and a third layer of titanium tungsten (TiW) deposited to a thickness of about 7,500 angstroms. It will be appreciated that the above-mentioned thickness values are merely illustrative and other thickness values suitable for particular processes, designs, or wafer sizes may well be specified.

The various layers of metal-one layer 202 may be deposited by any number of processes such as the aforementioned physical vapor deposition (PVD), including sputtering. Preferably, metal-one layer 202 is deposited by a first sputter deposition of TiW, followed by a sputter deposition of aluminum (Al) or aluminum copper alloy (AlCu), finally followed by a sputter deposition of TiW.

The TiW layer is preferably thin but sufficiently thick to act as a barrier to prevent diffusion of aluminum into the amorphous silicon anti-fuse material, which, if left unchecked, may degrade the anti-fuse material over time. Metal one layer 202 is then patterned into conductive lines using a conventional photoresist technique and an appropriate etchant.

After metal-one layer 202 has been deposited and patterned, an anti-fuse layer is deposited. The anti-fuse layer comprises one of the known anti-fuse materials, preferably amorphous silicon (A-Si), which has an intrinsic resistance in the millions of ohms or higher in its deprogrammed state. The anti-fuse layer is typically formed by blanket deposition by any number of processes, including chemical vapor deposition (CVD), and then etched back to form regions of anti-fuse material for the anti-fuse structures, of which anti-fuse layer 204 is exemplary.

After the anti-fuse layer 204 is formed, an etch stop layer is deposited thereon. Preferably, the etch stop layer comprises a dielectric material such as silicon nitride ($Si_3N_4$) or similarly suitable and known dielectric materials. In the alternative, the etch stop layer comprises a conductive material such as TiN, $WSi_2$, CoSi, $TaSi_2$ (Tantalum Silicide), or similarly suitable and known conductive materials. In the example of FIG. 2, however, etch stop layer 206 is a dielectric etch stop layer (an anti-fuse structure employing a conductive etch stop layer will be discussed in greater detail in FIGS. 4 and 5.)

Like the anti-fuse layer, the etch stop layer is typically formed by blanket deposition and then etched back to form regions of etch stop layer for the anti-fuses (of which etch stop layer 206 is exemplary). In one sample, etch stop layer 206 is in the range from about 600 to 1,250 angstroms thick, more preferably from about 800 to 1,100 angstroms thick and preferably about 1,000 angstroms thick.

Thereafter, an inter-metal oxide layer 208, comprising, e.g., silicon dioxide, is deposited. In one sample, inter-metal oxide layer 208 is about 8,000 angstroms thick. A via hole 212 is the etched through inter-metal oxide layer 208 using a conventional photoresist process and an appropriate etchant. The etchant chosen preferably has sufficient selectivity to stop at the interface of etch stop layer 206 and inter-metal oxide layer 208.

Since etch stop layer 206 of FIG. 2 is a dielectric etch stop layer, another etching is necessary to extend the via hole through to anti-fuse material layer 204. Consequently, another etching step, also using a conventional photoresist technique and an appropriate etchant such as, for example, $NS_3$ (for a $Si_3N_4$ dielectric etch stop layer), etches through dielectric etch stop layer 206 to the interface of anti-fuse layer 204 and dielectric etch stop layer 206.

After via hole 212 is formed through inter-metal oxide layer 208 and dielectric etch stop layer 206, metal two layer 210 is deposited into via hole 212 and over inter-metal oxide layer 208. Thereafter, the metal-two layer is etched back to form interconnect terminals for the anti-fuse structures of the IC.

In one embodiment, metal-two layer 210 preferably comprises the same three-level sandwich structure of TiW, aluminum or an alloy of aluminum and copper, and TiW. As mentioned earlier, the TiW layer acts as a barrier layer to minimize alloy-type interaction between the aluminum layer and the amorphous silicon anti-fuse material. It should be borne in mind that either or both of metal-one layer 202 or metal-two layer 210 can comprise simply titanium-tungsten or a suitable conducting material that does not degrade anti-fuse material layer 204. In that case, a barrier layer such as the TiW layer may be unnecessary.

Metal-one layer 202 and metal-two layer 210 form the two terminals of the anti-fuse structure. If a suitable programming voltage is applied, a conductive link is created out of and through anti-fuse material layer 204. This conductive link is shown in FIG. 2 as conductive link 214. In one embodiment, the programming voltage is between 10 volts and 20 volts and preferably at about 14 volts.

In accordance with one aspect of the present invention, etch stop layer 206 preferably comprises a dielectric material that has a high etch selectivity with respect to the anti-fuse material in anti-fuse material layer 204. Preferably, the etch selectivity provided by dielectric etch stop layer 206 is higher than that provided by the insulator material of inter-metal oxide layer 208. In other words, the dielectric material is preferably selected to allow the etchant to more finely discriminate between it and the anti-fuse layer than an etchant can discriminate between the inter-metal oxide layer and the anti-fuse layer.

Further, the etchant that is used to etch via hole 212 should also be sufficiently selective to discriminate between the etch stop material of etch stop layer 206, e.g., silicon nitride (SiN), and the underlying anti-fuse material of anti-fuse material layer 204. With an appropriate etchant (e.g., the aforementioned $NS_3$ in one example), little of the anti-fuse material is etched away when the via is etched through the dielectric layer 206.

Given the purpose of dielectric etch stop layer 206, it will be appreciated by those skilled in the art that the above-specified thickness values for etch stop layer 206 are merely illustrative. Etch stop layers 206 having other thicknesses may well be employed as long as they sufficiently protect the underlying anti-fuse layer during the initial etch step.

Because of this dielectric etch stop layer, the thickness of anti-fuse layer 204 that remains after the via etch step is better controlled, resulting in anti-fuse structures having a more uniform anti-fuse layer thickness. Concomitantly, the programming voltages of the anti-fuse structures of a given IC are more uniform, thereby reducing the infant mortality failure of the deprogrammed states. The improved control over the programming voltage variations also facilitates scalability of the anti-fuse structures to sub-micron or even smaller processes without jeopardizing device reliability.

Figure 3:
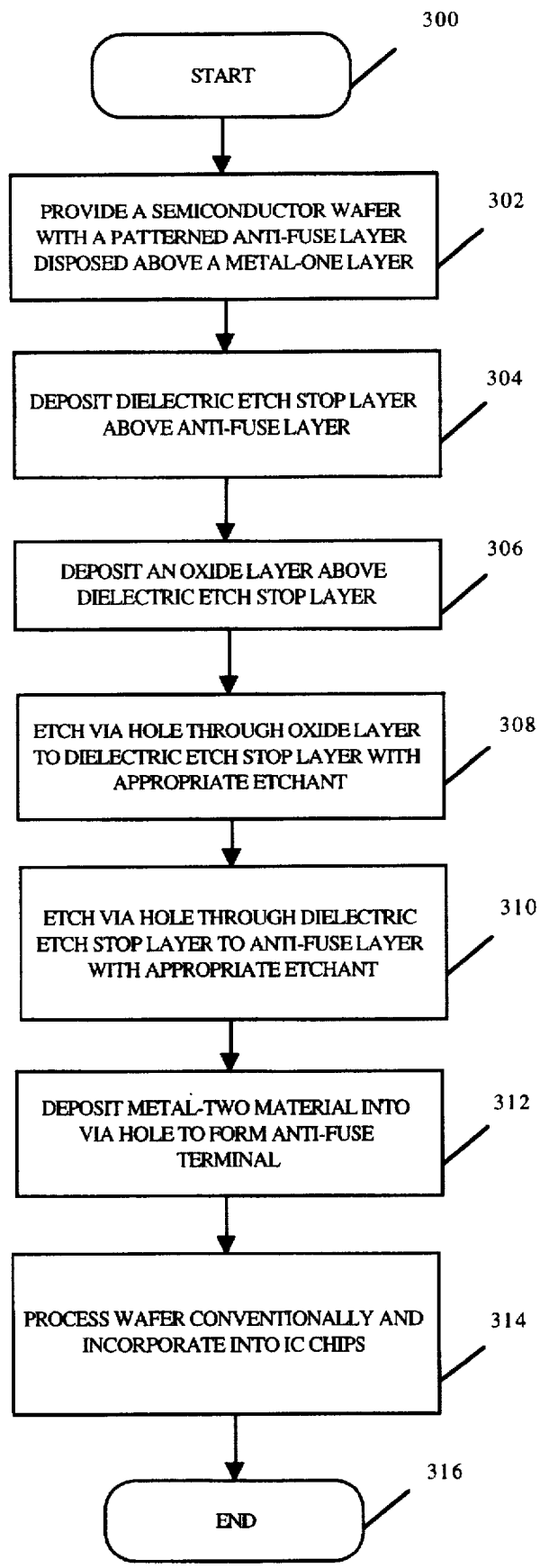
FIG. 3 shows, in accordance with one aspect of the present invention, a method for manufacturing IC chips that incorporate the inventive dielectric etch stop based anti-fuse structure of FIG. 2.

FIG. 3 shows, in accordance with one aspect of the present invention, a method for manufacturing IC chips employing the inventive dielectric etch stop based anti-fuse structure, e.g., anti-fuse structure 200 of FIG. 2. In step 302, a semiconductor wafer, such as a silicon wafer, having a patterned anti-fuse layer disposed above a metal-one layer is provided. In step 304, the dielectric etch stop layer is deposited and patterned as discussed earlier. In step 306, an oxide layer, representing the inter-metal oxide, is formed above the dielectric etch stop layer.

The via hole is etched through the inter-metal oxide layer in step 308, using a conventional photoresist process and an appropriate etchant, to the dielectric etch stop layer. In step 310, the via hole is etched again, also using a conventional photoresist process and an appropriate etchant, to extend through the dielectric etch stop layer to the interface of the anti-fuse layer and the dielectric layer. The dielectric etch stop layer and the etchants are selected so that little or none of the anti-fuse material is removed in steps 308 and 310.

In step 312, conductive material is deposited into the via hole to form a metal-two layer. As mentioned earlier, the deposited conductive material is then etched back to form terminals for the anti-fuse devices. In step 314, the wafer undergoes additional semiconductor processing steps of a conventional nature to be finished and incorporated into IC chips.

Figure 4:
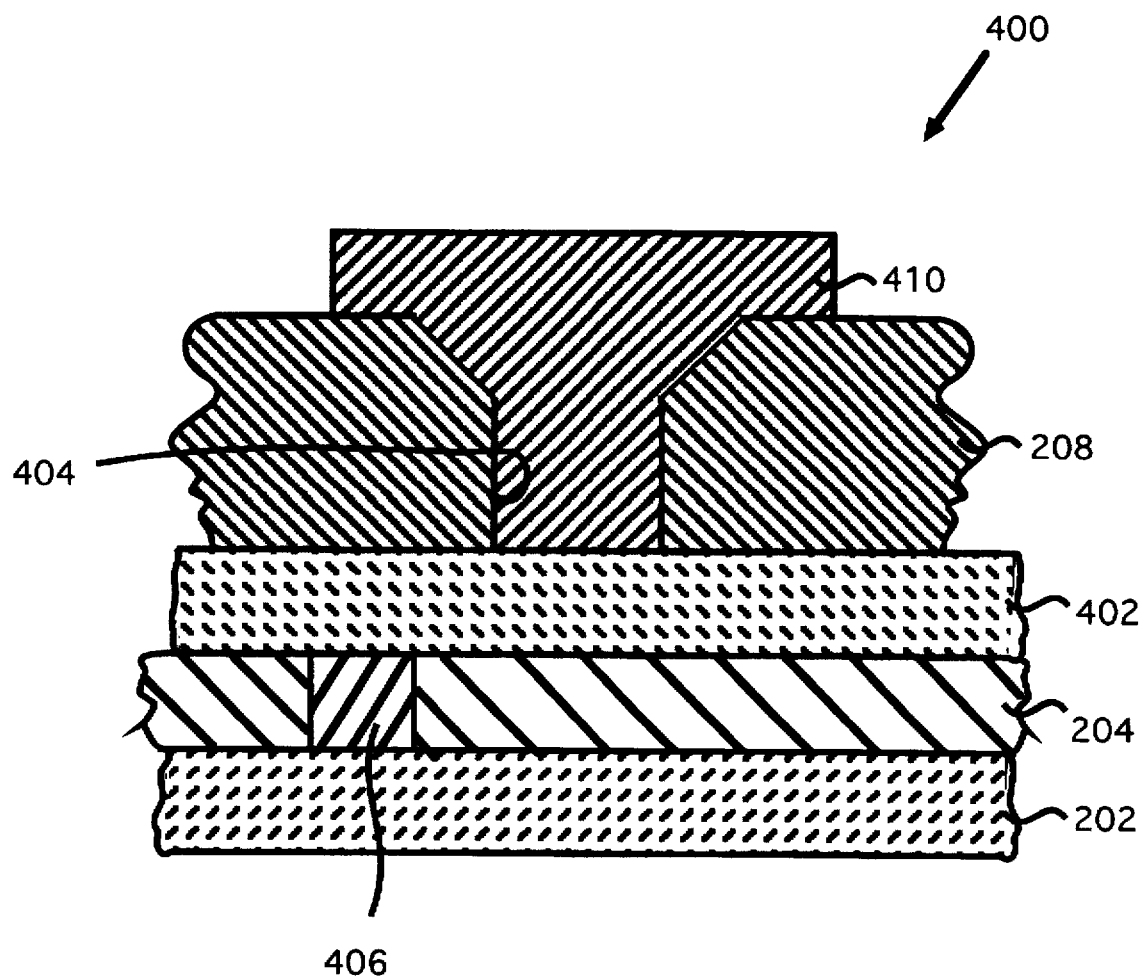
FIG. 4 shows, in another embodiment of the present invention, a conductive etch stop based anti-fuse structure.

FIG. 4 shows, in another embodiment of the present invention, a conductive etch stop based anti-fuse structure 400. The anti-fuse structure of FIG. 4 is said to be conductive etch stop based because, as will be shown later herein, there is advantageously provided a conductive etch stop layer to maintain uniform anti-fuse layer thickness. Anti-fuse structure 400 includes the aforementioned metal-one layer 202, and anti-fuse material layer 204. Subsequent to the formation of anti-fuse material layer 204, a conductive etch stop layer is deposited. The conductive etch stop layer is preferably formed by blanket deposition via a conventional PVD process such as sputtering. The deposited conductive etch stop layer is then patterned to form regions of conductive etch stop for the anti-fuse structures, of which conductive etch stop layer 402 of FIG. 4 is exemplary.

Conductive etch stop layer 402 preferably comprises TiW, although other conductive materials that does not unduly degrade the anti-fuse material, e.g., amorphous silicon, may well be employed. In one sample, the thickness of conductive etch stop layer 402 has a thickness from about 500 to about 1,250 angstroms, and preferably at about 750 angstroms.

After conductive etch stop layer 402 is formed, a layer of oxide is deposited, preferably through a conventional CVD process, and etched to form inter-metal oxide layer 208. A via hole 404 is then etched, using a conventional photoresist process and an appropriate etchant (such as $SF_6$ for a TiW conductive etch stop layer) through inter-metal oxide layer 208 to the interface of conductive etch stop layer 402 and inter-metal oxide 208. The etchant employed during this etch step preferably has sufficient selectivity to stop before reaching the underlying anti-fuse material. Depending on the process and the etchant employed, conductive etch stop layer 402 should, at minimum, be sufficiently thick to withstand etching without allowing any or a significant amount of the underlying anti-fuse material to be removed.

Thereafter, a metal-two layer is deposited, preferably through sputter deposition or other suitable physical vapor deposition (PVD) processes. In the case of the conductive etch stop, it is not absolutely necessary that the metal-two layer represent a sandwich structure, e.g., the aforementioned sandwich structure that makes up metal-two layer 210 of FIG. 2. This is because conductive etch stop layer 402 may already protect the anti-fuse material from alloy-type degradation reactions, thereby obviating the need for a barrier layer.

As before, metal-one layer 202 and metal-two layer 410 form the two terminals of the anti-fuse structure. When a programming potential difference is applied between metal-one layer 202 and metal-two layer 410 of anti-fuse structure 400, a conductive link 406 is formed through conductive etch stop layer 402.

Note that in anti-fuses that employ the conductive etch stop, e.g., anti-fuse structure 400 of FIG. 41, it is not necessary to etch the via through the conductive etch stop layer. In fact, both metal-two layer 410 and conductive etch stop layer 402 act as one electrode terminal for anti-fuse structure 400. Advantageously, via 404 may be formed anywhere in inter-metal oxide layer 208 that contacts conductive etch stop layer 402. This feature advantageously gives the IC designer additional flexibility in the layout of the anti-fuse vias in an IC circuit.

In contrast, the via hole 212 through inter-metal oxide layer 208 and dielectric etch stop layer 206 of anti-fuse structure 200 of FIG. 2 must be substantially aligned. With a dielectric etch stop layer, however, it is possible to predict with more certainty the location in dielectric etch stop layer 206 where conductive link 214 will be formed. This is because conductive link 214 is typically formed beneath via hole 212, where there are localized electric field lines when a programming voltage is applied. Consequently, it is possible to control the location and size of conductive link 214 by controlling of the location and size of via hole 212.

In contrast, the entire conductive etch stop layer 402 acts as an anti-fuse terminal in the anti-fuse structure 400 of FIG. 4. Without localized electric field lines, anti-fuse structure 400 may have its conductive link 406 formed anywhere in anti-fuse material layer 204 when a programming voltage is applied thereto.

Figure 5:
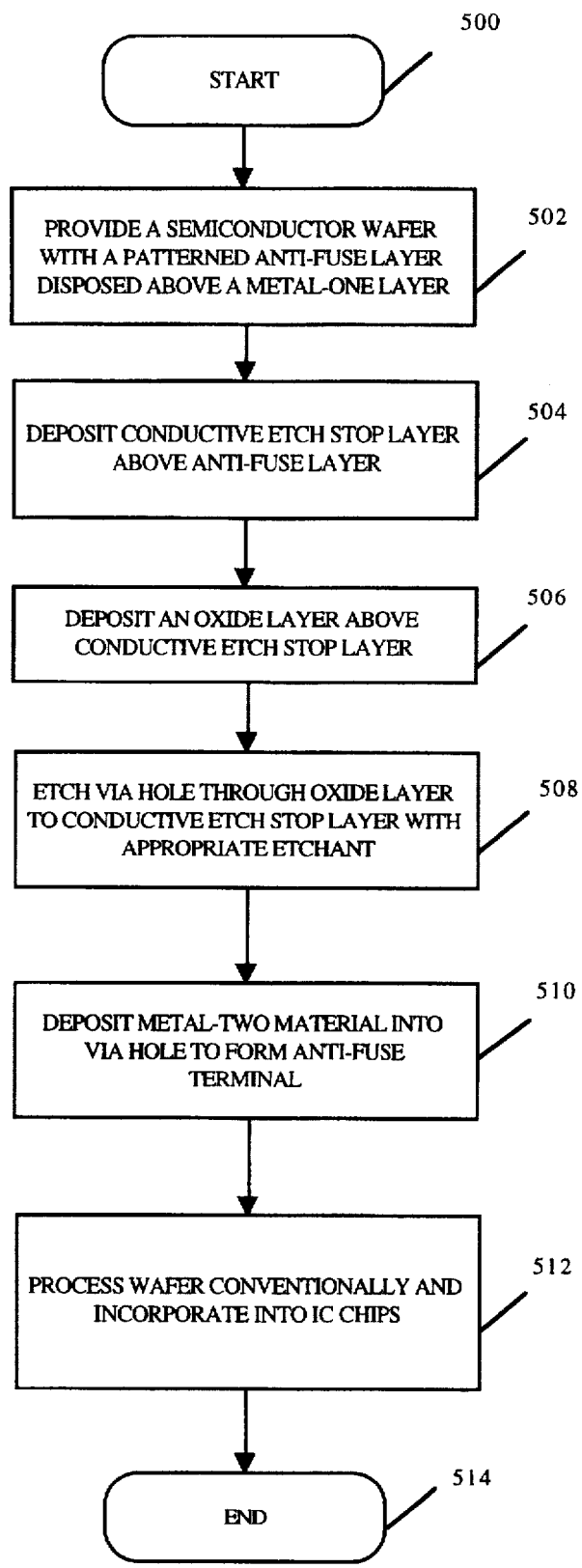
FIG. 5 shows, in accordance with yet another aspect of the present invention, a method for manufacturing IC chips that incorporate the inventive conductive etch stop based anti-fuse structure of FIG. 4.

FIG. 5 shows, in accordance with one aspect of the present invention, a method for manufacturing IC chips employing the inventive conductive etch stop based anti-fuse structure, e.g., anti-fuse structure 400 of FIG. 4. In step 502, a semiconductor wafer, such as a silicon wafer, which has a patterned anti-fuse layer disposed above a metal-one layer, is provided. In step 504, the conductive etch stop layer is deposited and patterned as discussed earlier. In step 506, an oxide layer, representing the inter-metal oxide, is formed above the conductive etch stop layer.

The via hole is etched through the inter-metal oxide layer in step 508, using a conventional photoresist process and an appropriate etchant, to the conductive etch stop layer.

In step 510, conductive material is deposited into the via hole to form a metal-two layer. As mentioned earlier, the deposited conductive material is then etched back to form terminals for the anti-fuse devices. In step 512, the wafer undergoes additional semiconductor processing steps of a conventional nature to be finished and incorporated into IC chips.

The IC chip fabricated using either of the methods described in FIGS. 3 and 5 may then be incorporated in an electronic device, e.g., any of the of well known commercial or consumer electronic devices, including digital computers.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An anti-fuse structure on a semiconductor substrate, comprising:

a metal-one layer;

an anti-fuse layer disposed above said metal-one layer, said anti-fuse layer having a first resistance value when said anti-fuse structure is unprogrammed and a second resistance value lower than said first resistance value when said anti-fuse structure is programmed;

a conductive etch stop layer disposed above said anti-fuse layer;

an inter-metal oxide layer disposed above said conductive etch stop layer, said inter-metal oxide layer having a via formed therein at a given position, said given position being above said conductive etch stop layer and selected for ease of layout irrespective whether said via is substantially aligned with a programmed region to be formed in said anti-fuse layer; and a metal-two layer disposed above said inter-metal oxide layer, a portion of said metal-two layer being in electrical contact with said anti-fuse layer through said via in said inter-metal oxide layer, wherein said anti-fuse structure is programmed to form said programmed region in said anti-fuse layer when a programming voltage is applied between said metal-one layer and said metal-two layer.

2. The anti-fuse structure of claim 1 wherein said conductive etch stop layer comprises a material selected from the group consisting of TiN, WSi2, CoSi, TaSi2.

3. A method for fabricating an anti-fuse structure on a semiconductor substrate, said semiconductor substrate having thereon an anti-fuse layer disposed above a metal-one layer, comprising:

depositing an anti-fuse layer above said metal-one layer, said anti-fuse layer having a first resistance value when said anti-fuse structure is unprogrammed and a second resistance value lower than said first resistance value when said anti-fuse structure is programmed;

depositing a conductive etch stop layer above said anti-fuse layer;

depositing an inter-metal oxide layer above said conductive etch stop layer;

etching a via at a given position through said inter-metal oxide layer, said given position being above said conductive etch stop layer and selected for ease of layout irrespective whether said via is substantially aligned with a programmed region to be formed in said anti-fuse layer; and depositing a metal-two layer above said inter-metal oxide layer and into said via, a portion of said metal-two layer being in electrical contact with said anti-fuse layer through said via in said inter-metal oxide layer, wherein said anti-fuse structure is programmed when a programming voltage is applied between said metal-one layer and said metal-two layer.

4. The method of claim 3 wherein said conductive etch stop layer permits said portion of said metal-two layer to make an electrical contact with said anti-fuse layer without physically contacting said anti-fuse layer.

5. The method of claim 4 wherein said conductive etch stop layer comprises a material selected from the group consisting of TiN, WSi2, CoSi, TaSi2.

6. An integrated circuit having a semiconductor substrate and an anti-fuse structure formed on said semiconductor substrate, said anti-fuse structure comprising:

a metal-one layer;

an anti-fuse layer disposed above said metal-one layer, said anti-fuse layer having a first resistance value when said anti-fuse structure is unprogrammed and a second resistance value lower than said first resistance value when said anti-fuse structure is programmed;

a conductive etch stop layer disposed above said anti-fuse layer;

an inter-metal oxide layer disposed above said conductive etch stop layer, said inter-metal oxide layer having a via formed therein at a given position, said given position being above said conductive etch stop layer and selected for ease of layout irrespective whether said via is substantially aligned with a programmed region to be formed in said anti-fuse layer; and a metal-two layer disposed above said inter-metal oxide layer, a portion of said metal-two layer being in electrical contact with said anti-fuse layer through said via in said inter-metal oxide layer, wherein said anti-fuse structure is programmed when a programming voltage is applied between said metal-one layer and said metal-two layer.

7. The integrated circuit of claim 6 wherein said conductive etch stop layer permits said portion of said metal-two layer to make said electrical contact with said anti-fuse layer without physically contacting said anti-fuse layer.

8. The integrated circuit of claim 6 wherein said conductive etch stop layer comprises a material selected from the group consisting of TiN, WSi2, CoSi, TaSi2.

9. The integrated circuit of claim 8 wherein said conductive layer has a thickness of about 500 angstroms to about 1250 angstroms.

10. The integrated circuit of claim 8 wherein said conductive layer has a thickness of about 750 angstroms.

11. The anti-fuse structure of claim 2 wherein said conductive layer has a thickness of about 500 angstroms to about 1250 angstroms.

12. The anti-fuse structure of claim 2 wherein said conductive layer has a thickness of about 750 angstroms.

13. An anti-fuse structure on a semiconductor substrate, comprising:

a metal-one layer;

an anti-fuse layer disposed above said metal-one layer, said anti-fuse layer having a first resistance value when said anti-fuse structure is unprogrammed and a second resistance value lower than said first resistance value when said anti-fuse structure is programmed;

a conductive etch-stop layer disposed above said anti-fuse layer;

an inter-metal oxide layer disposed above said etch stop layer, said inter-metal oxide layer having a via formed therein, said via having a lateral cross-section smaller than a lateral cross-section of said conductive etch-stop layer, thereby permitting said via to be placed at a given position selected for ease of layout irrespective whether said via is substantially aligned with a programmed region to be formed in said anti-fuse layer; and a metal-two layer disposed above said inter-metal oxide layer, a portion of said metal-two layer being in electrical contact with said anti-fuse layer through said via in said inter-metal oxide layer, wherein said anti-fuse structure is programmed to form said programmed region in said anti-fuse layer when a programming voltage is applied between said metal-one layer and said metal-two layer.

* * * * *